United States Patent [19]

Tanguay et al.

[11] Patent Number: 5,089,771
[45] Date of Patent: Feb. 18, 1992

[54] READING DEVICE FOR A WATT-HOUR METER

[75] Inventors: Francois Tanguay; Benoit Allard, both of Granby, Canada

[73] Assignee: Nertec Design, Quebec, Canada

[21] Appl. No.: 480,029

[22] Filed: Feb. 14, 1990

[30] Foreign Application Priority Data

Feb. 15, 1989 [CA] Canada ............... 591175

[51] Int. Cl.$^5$ .................. G01R 27/26; G01D 5/34
[52] U.S. Cl. .................................. 324/142; 324/96; 324/157; 250/231.13; 340/870.02
[58] Field of Search ............... 324/142, 103 R, 137, 324/175, 96; 360/870.02, 870.03, 870.22; 250/231.13, 231.17; 364/483, 492

[56] References Cited

U.S. PATENT DOCUMENTS

| | | | |
|---|---|---|---|
| 3,127,594 | 3/1964 | Roe et al. | 324/137 |
| 3,842,268 | 10/1974 | Cornell | 324/175 |
| 3,875,406 | 4/1975 | Holeman | 340/870.22 |
| 4,034,292 | 7/1977 | McClelland, III | 324/137 |
| 4,201,911 | 5/1980 | Dering | 250/231.17 |
| 4,204,115 | 5/1980 | Boldridge | 324/175 |
| 4,321,531 | 3/1982 | Marshall | 324/137 |
| 4,327,362 | 4/1982 | Hoss | 340/870.02 |
| 4,928,009 | 5/1990 | Ikebe et al. | 250/231.13 |

Primary Examiner—Kenneth A. Wieder
Assistant Examiner—Vinh P. Nguyen
Attorney, Agent, or Firm—Fay, Sharpe, Beall, Fagan, Minnich & McKee

[57] ABSTRACT

In a watt-hour meter for metering electricity consumption of the type including: a disc mounted to a rotation shaft and a register mechanism. The watt-hour meter is further provided with a reading device including a light source creating a light beam; a light detector; a light interrupting device mounted on the shaft of the disc; a pulse meter and a protective cover; wherein the light source and light detector are protected from outside light, which may influence the reading of the pulse meter, by the protective cover. This reading device may be coupled to a data transmission line via a data recorder to allow remote reading of the electricity consumption.

12 Claims, 6 Drawing Sheets

READING DEVICE FOR A WATT-HOUR METER

FIELD OF THE INVENTION

A watt-hour meter for metering electricity consumption of the type including: a base; a disc mounted to a rotation disc and a register mechanism. Said watt-hour meter is further provided with a reading device.

DESCRIPTION OF PRIOR ART

Watt-hour meters are available in a wide variety of models and are used to calculate the amount of electrical power supplied to consumers.

Although, most meters are placed so that the register dials can be read from outside, many of them are still inaccessible from the outside and the cooperation of the consumer is required to read them. Furthermore, the necessity to have someone read each and every meter on a regular basis is time consuming and more and more costly.

It is therefore necessary to take appropriate steps to enable watt-hour meters to be remotely read via an accurate system. Daily or other periodic remote reading assures that any mis-operation is known immediately. As a result, the customer can be better protected from possible overbilling resulting from inaccurate readings.

Many improvements were made to watt-hour meters to improve the reading and also to allow remote reading of the electrical power consumption. However, these improvements lack many of the features of the prevent invention.

U.S. Pat. No. 3,842,268 (Cornell) shows a remote reading meter which includes a light source and reflector for illuminating a rotatable scanning disc to obtain read-out signals indicative of the rotational positions of the indicator shaft. This apparatus is complex, uses several additional parts, and therefore, is exposed to more frequent breakdowns.

U.S. Pat. No. 3,127,594 (Roe et al) shows a remote metering apparatus including a pickup device in the form of a light source and a phototransistor for installation in an existing watt-hour meter. The beam of light is sequentially reflected only by the reflective segments on the disc with the reflected beam being focused upon the lens of a phototransistor.

U.S. Pat. No. 4,204,115 (Boldridge Jr.) shows a device which comprises two spherical lenses disposed generally in the plane of the disc along a line which is generally perpendicular to a radius of the disc. A pulse is emitted whenever a darkened region of the disc is sensed. Since the reading device is placed outside the glass enclosure of the meter, same must be carefully aligned for an accurate reading. This alignment is difficult to achieve and therefore time consuming.

U.S. Pat. No. 4,321,531 (Marshall) shows a direction sensitive pulse initiator for a watt-hour meter having a rotating disc. A pair of sensors sense the presence of an indicator portion or portions on the rotating disc or an auxiliary disc to produce electrical signals.

U.S. Pat. No. 3,875,406 (Holeman) and U.S. Pat. No. 4,327,362 (Hoss) show a watt-hour meter wherein the electrical consumption is converted into an electrical analog signal.

In addition to the disadvantages mentioned above which are inherent to each of the apparatuses of the prior art, a common drawback is that they are influenced, at different levels, by outside light such as sunlight or artificial light such as that produced by a flashlight o any similar high intensity light.

When such outside light is directed to the detector of the reading device, it creates a "false" signal, thus preventing said device from counting pulses in proportion to the electricity consumption, and this, until the light is turned off again. This drawback has caused great monetary loss to public utility companies, since it was possible for unscrupulous clients to literally "stop" the counting of the reading device by directing a light beam to the photodetector.

Furthermore, some of the prior art remote reading devices use additional dials and/or pinion wheels which increase friction on the rotor of the reading disc. Therefore, the meter must be recalibrated after the installation of said reading device and more importantly, the use of these additional elements increases cost and the possibility of breakdowns.

According, it is desirable to provide a reading device for a watt-hour meter which will overcome the above mentioned drawbacks, and which may be remotely read.

OBJECTS OF THE PRESENT INVENTION

An object of the present invention is to provide a reading device for a watt-hour meter which is easy and economical to use.

A further object of the present invention is to provide a reading device for a watt-hour meter which can be easily retrofitted on most existing watt-hour meters.

A further object of the present is to provide a reading device for a watt-hour meter which will reduce the friction resulting from its use.

A further object of the present is to provide a reading device for a watt-hour meter which will reduce the maintenance costs.

A further object of the present is to provide a reading device for a watt-hour meter which may be provided with a direction sensitive pulse initiator device.

Still a further object of the present invention is to provide a reading device for a watt-hour meter which will facilitate the reading of the electrical power consumption.

Still another object of the present invention is to provide a reading device for a watt-hour meter which may be coupled to a data recorder and to data transmission means for remote reading of same.

Still another object of the present invention is to provide a reading device for a watt-hour meter which will reduce the influence of outside light on the light detector.

Finally, from a financial standpoint and as a matter of justice to both consumer and public utility company, the constant accuracy of watt-hour meters is of most concern, and in this sense, the meter must comprise what is necessary to insure such accuracy. Therefore, it is a general object of the present invention to provide a reading device for a watt-hour meter having the above described advantages.

These and other objects and advantages of the present invention will be obtained by means of a watt-hour meter reading apparatus. The apparatus includes a rotation shaft; a disc mounted to the rotation shaft; register means responsive to the rotation of said disc; said watt-hour meter being further provided with a reading device. The reading device including:

light source means creating a light beam;

light detection means placed at a certain distance from the light source means, the said rotation shaft being situated in the path of said light beam.

light interrupting means which interrupt sequentially said light beam during the rotation of said shaft so as to produce light pulses on the light detection means;

light pulse counting means connected to said light detection means; and a protective cover covering said light source means and the light detection means and partially surrounding said shaft of said disc.

The above gives a broad description of the present invention, a preferred form of which will now be described by way of example only with reference to the accompanying drawings.

DESCRIPTION OF DRAWINGS

The invention will now be described in detail with reference to a specific embodiment thereof which is illustrated by way of example, in the accompanying drawings, in which.

DESCRIPTION OF A PREFERRED EMBODIMENT

Figure 1:
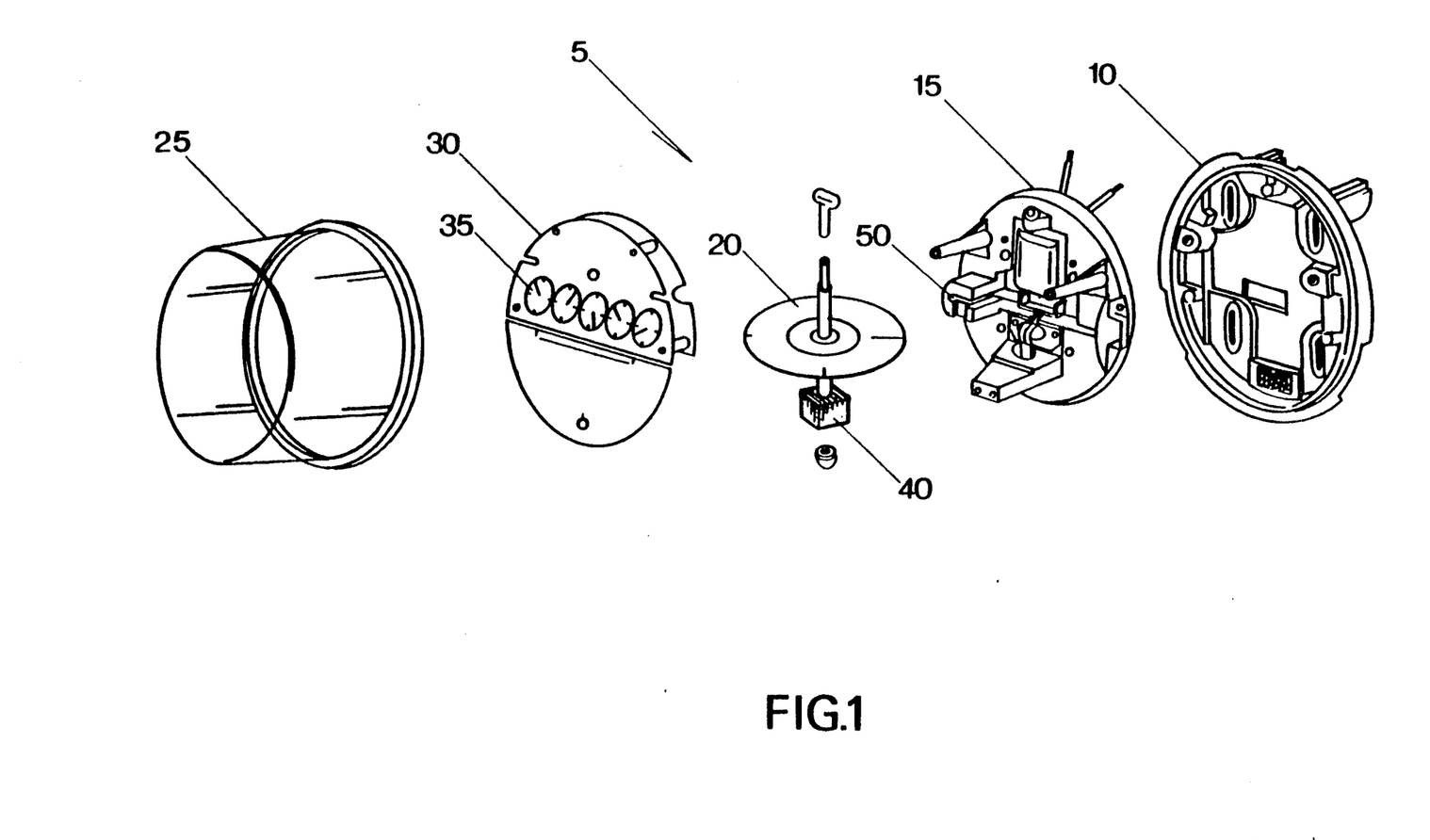
FIG. 1 is an exploded perspective view of the watt-hour meter comprising the reading device of the present invention.

With reference to FIG. 1, an exploded watt-hour meter 5 is shown. Said meter 5 comprises a base 10, permanent magnets 15, a disc 20, a glass cover 25, a register mechanism 30 provided with reading dials 35 and a reading device 40 according to the present invention.

Figure 2:
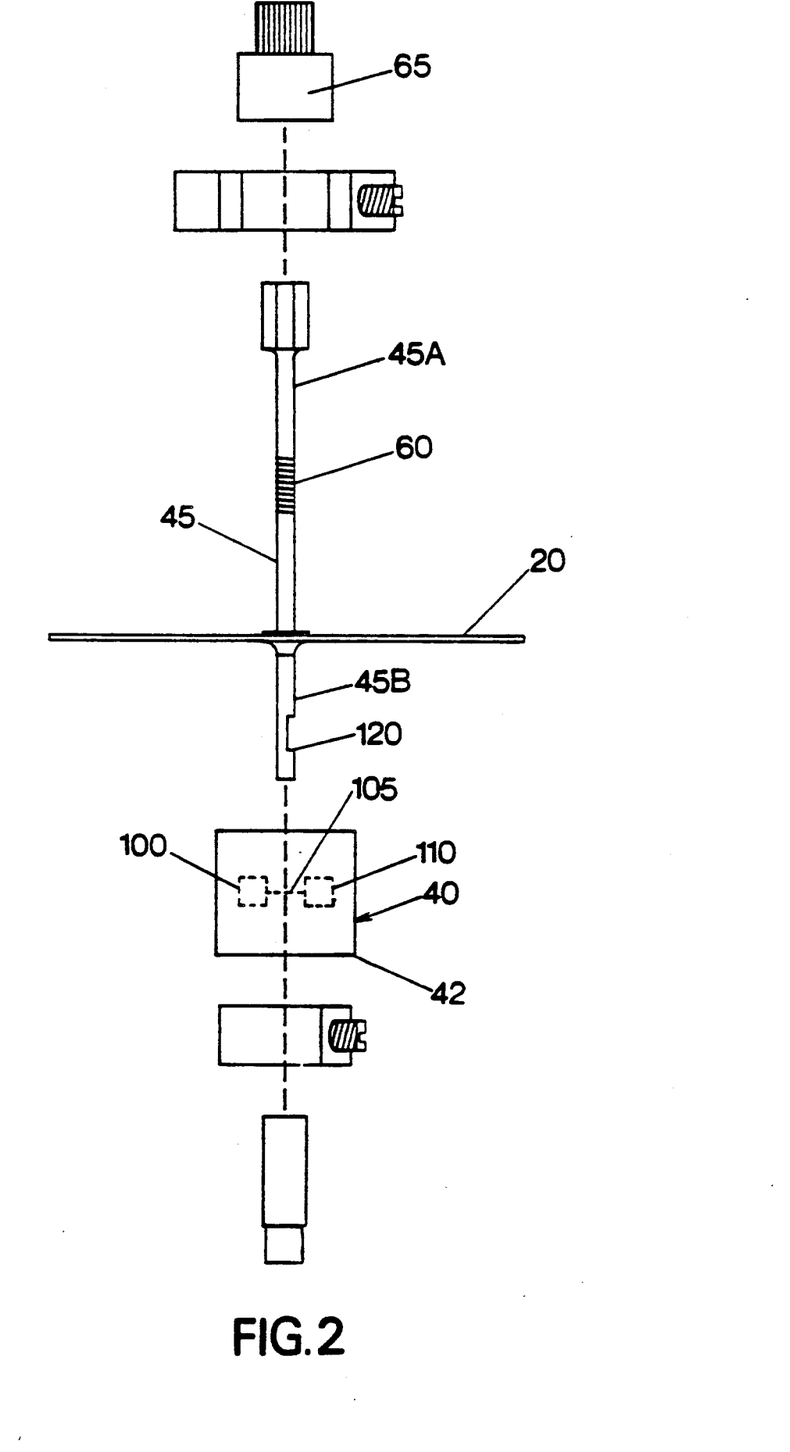
FIG. 2 is an exploded elevational view of the rotary disc of the watt-hour meter according to the present invention.
Figure 3:
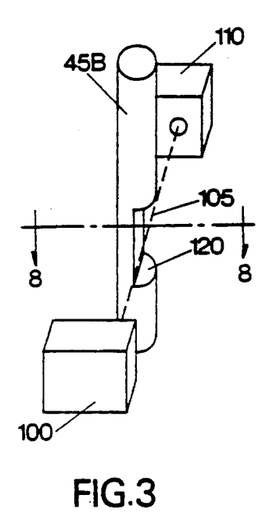
FIG. 3 is an elevational view of the light interrupting means according to the present invention.

With reference to FIG. 2, the disc 20 is mounted on a vertical shaft 45. Said shaft 45 has an upper end 45A and a lower end 45B.

The disc 20 is arranged to rotate through the air gaps 50 (FIG. 1) of both the composite permanent magnets 15 comprising the generator element (not shown). A pinon 60 situated near the upper end 45A of said shaft 45, meshes with and drives a gear wheel at the rear of the register mechanism 30.

A top bearing 65 whose principal function is merely to hold the disc 20 and shaft 45 centered comprises a stationary pivot (not shown) that projects downward into a hole in the top of the disc shaft 45.

The register mechanism 30 by taking into account the revolutions of the disc 20, with proper gear ratio, records the energy that has passed through the meter 5 in kilo watt-hours.

The basics of watt-hour meters being well known in the art, and since the reading device according to the present invention can be retrofitted on existing watt-hour meters the latter will not be described in further details.

The reading device 40 (FIG. 2) according to the present invention comprises a light source 100 which emits a light beam 105, a photodetector 110 which receives the light beam from said light source, and a protective cover 42 to protect the light source 100 and the photodetector 110 from outside light which may influence same.

Said protective cover 42 (FIG. 10) is generally of cube shape and comprises a first set of openings 155 and 160 to accommodate the shaft 45B, the diameter of said openings is barely larger than said shaft 45B, and a similar opening 165, for the wiring 170 of the light source and the photodetector, is also provided.

Figure 10:
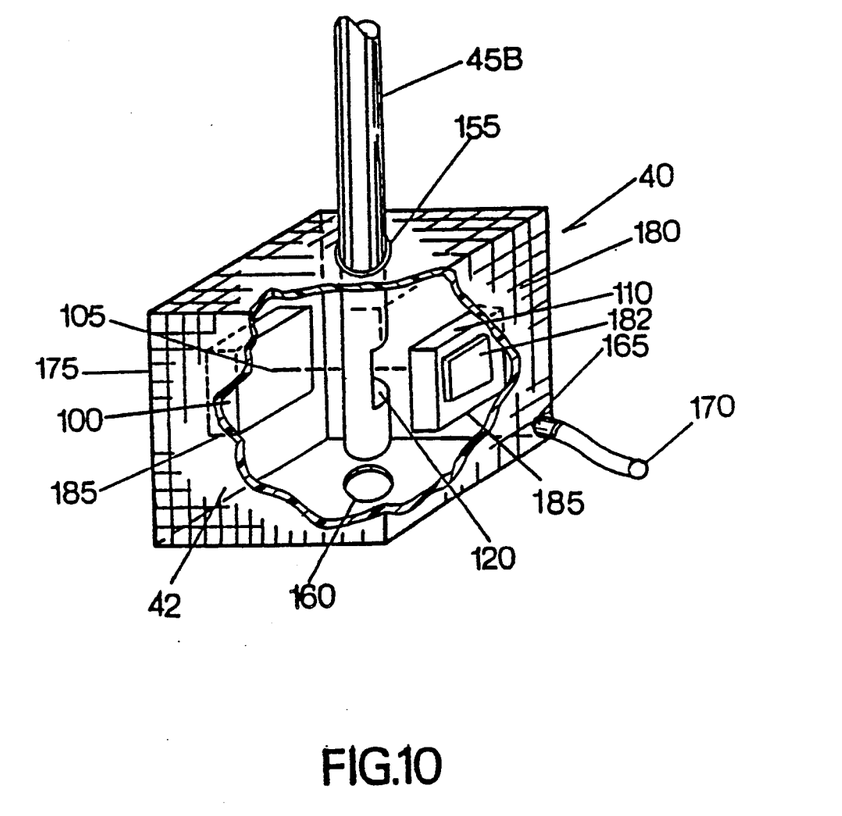
FIG. 10 is a perspective view of the protective cover according to the present invention.

It is important to mention that the openings 155, 160 and 165 must be as close as possible to the diameter of, respectively the shaft 45B and the wire 170 so as to diminish to minimum the influence of outside light. For greater light protection, the area of the shaft located near such openings 155 and 160 may be coated with a light absorbing substance.

The protective cover 42 may be molded in any opaque plastic, however, it is to be understood that other material may be used for the same purpose. Walls 175 and 180 of the protective cover 42 may be provided with securing means 185 to hold and keep the light source 100 and the photodetector 110 in constant alignment. An opto coupled device in housing may be used to ensure the constant alignment of light source and the photodetector.

The beam of light 105 emitted by the light source is sequentially interrupted by an interrupting means placed on the shaft, these interruptions create light pulses, the number of which is proportional to the consumption of electrical power.

Figure 9:
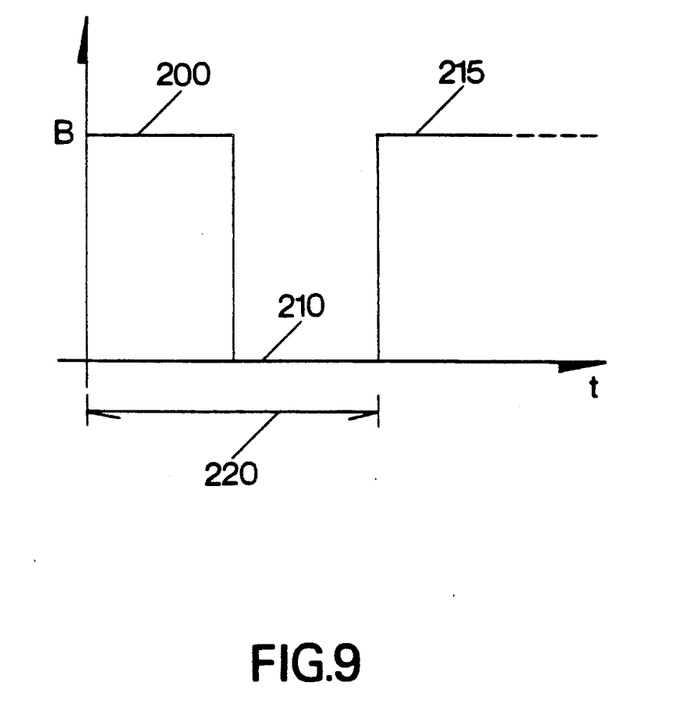
FIG. 9 is a graphic showing the signal produced by using the interrupting means of FIG. 3.

With respect to FIGS. 3, 4, 5 and 6, said interrupting means may comprise: the ungrooved portion of the shaft opposite to groove 120 or opening 125 or simply a black strip 130 applied on the shaft 45B. The interrupting means will interrupt the light beam 105 and therefore will produce a pulse so as to cause the voltage to vary from near zero to full B voltage as illustrated in FIG. 9. The light source 100 includes a single light emitting element whereas the photodetector includes a light sensing element.

Figure 8:
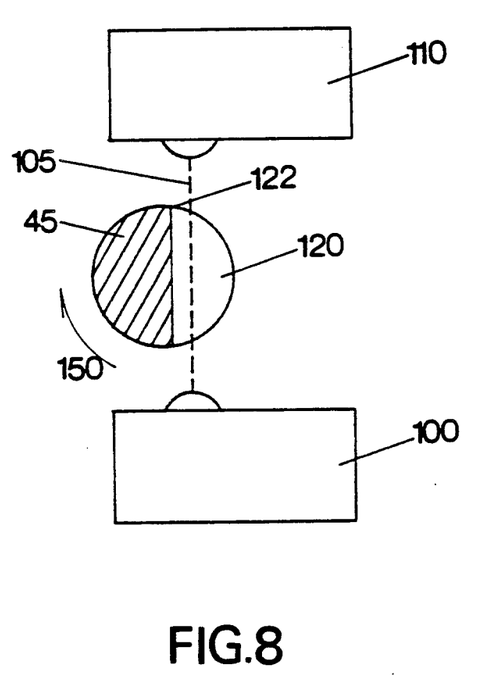
FIG. 8 is a sectional view taken along line 8—8 in FIG. 3.

With reference to FIG. 8, when the shaft 45 is in the position illustrated, the light beam 105 hits the photodetector 110 so as to create the signal 200 shown in FIG. 9.

When the meter 5 records electrical power consumption, the shaft 45 rotates (in the present example in a clockwise rotation 150), the solid portion 122 or ungrooved portion of shaft 45 interrupts the light beam thus producing a zero signal 210. After a complete rotation 220 of shaft 45, the light beam can, again, pass though groove 120, and hits the photodetector 110 so as to change the signal 210 to 215 and so on for every rotation of said disc 20.

By counting the number of peaks in signal 200 with a light pulse counting device 182 connected to the light detection device 110 and applying a predetermined constant applicable to the specific watt-hour meter used, the electrical power consumption can be obtained. It is to be appreciated that the light pulse counting device 182 can also be connected to the light detection device 110 through the wirings 170, with the pulse meter 182 located at the distal end of wirings 170.

Figure 4:
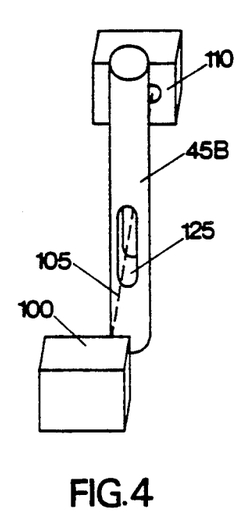
FIG. 4 shows a modification to the light interrupting means of FIG. 3.

It is important to mention that, for the embodiment shown in FIG. 4, it will be necessary to divide the number of pulses by two, since there are two signals per revolution of shaft 45.

Figure 5:
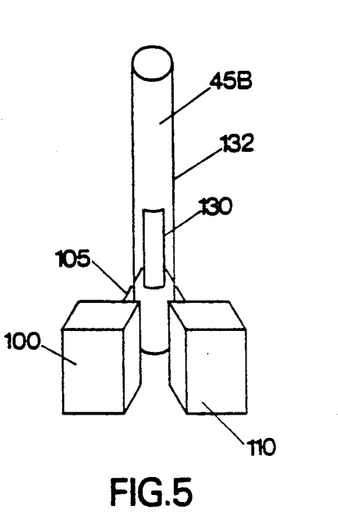
FIG. 5 shows another modification to the light interrupting means of FIG. 3.

In the embodiment shown in FIG. 5, the lower end 45B of shaft 45 or the entire shaft is coated or made of a reflective material 132. Therefore, the light coming from the light source 100 is reflected from shaft 45B and hits the photodetector 110 during each rotation of the disc 20. However, this reflection will be absent during light non-reflection caused by the black strip 130. In this particular case, by counting the number of times the light is interrupted over a certain period of time it is possible to obtain the electrical power consumption.

Figure 6:
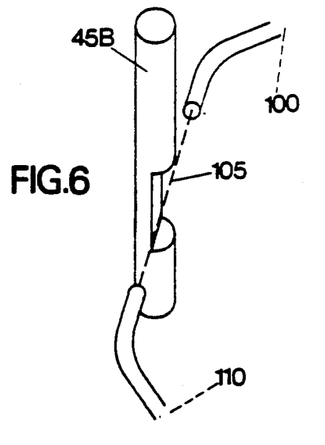
FIG. 6 shows still another modification of FIG. 3 and using optical fibers.

In the embodiment illustrated in FIG. 6, the light beam is transported from the light source and to the detector by optical fibers. The light source may thus be placed in a remote location. Optical fibers can be used when the space for a standard light source and a standard light detector is restricted.

The light to and from the source means may be in the infrared light range. The light may be generated by a light emitting diode.

Since the photodetectors are well known in the art, and since the present invention does not relate specifically to same, the applicant does not wish to elaborate further.

For details on the light sources and photodetectors, the reader may refer to U.S. Pat. No. 4,327,362.

Finally, the reading device 40 may be coupled to a data transmission line such as a telephone line via a data recorder to read the information with respect to the electrical power consumption, this reading an be accomplished at a regular rate for example, monthly or weekly.

Figure 7:
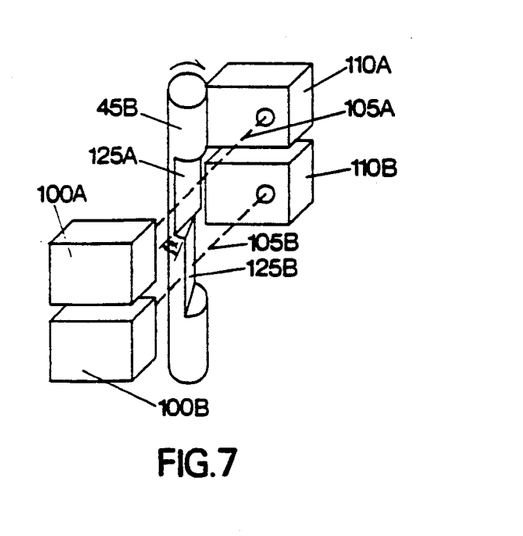
FIG. 7 shows yet another embodiment of the light interrupting means used to determine the direction of rotation of the disc.

The reading device 40 of the present invention may be provided with a direction sensitive pulse initiator as shown in FIG. 7. This, in certain cases the rotating disc 20 of the watt-hour meter may rotate in either a clockwise or a counterclockwise direction, such system is necessary to determine the direction of rotation.

In the embodiment shown, for a clockwise rotation of the disc 20, the light beam 105A from first light source 100A activates the first photodetector 110A, then, both photodetectors 110A and 110B, and finally, the photodetector 110B. In case of a counter clockwise rotation, the order of activation of photodetectors 110A and 110B is 110B, 110B–110A and finally, 110A. With the appropriate electronic circuit, it is thus possible to detect the direction of rotation.

By placing the two light sources and photodetectors in stacked relation and by providing shaft 45B with grooves 125A and 125B or with opening (not shown) that is, according to the embodiment of FIG. 7, the electronic circuitry is less expensive to manufacture, since the two detectors and the two light sources may be placed on the same printed circuit. Therefore, the alignment of the photodetectors and the light sources is always optimum.

The angle α between grooves 125A and 125B is not critical to the direction sensitive pulse initiator. However, at a certain degree of rotation, the angle α must be such that the two photodetectors are activated at the same time.

While the principles of the invention have now been made clear in the illustrated embodiments, it will be immediately obvious to those skilled in the art, that many modification of structure, arrangements, proportions, elements, materials and components used in the practice of the invention and otherwise, may be brought to the present invention without departing from its principles. The appended claims are therefore intended to cover and embrace any such modifications within the limits only of the true spirit and scope of the invention.

Finally, despite the fact that a preferred embodiment has been described in detailed, it is to be understood that a reading device for the present invention maybe used with few modifications for monitoring gas and/or water consumption.

We claim:

1. In a watt-hour meter for metering electrical power consumption of the type including, a rotation shaft, a disc mounted to the rotation shaft, a register means responsive to the rotation of said disc, said watt-hour meter being further provided with a reading device responsive to rotation of the rotation shaft, the reading device comprising:
   a light source means for producing a light beam;
   a light detection means placed at a certain distance from the light source means, the rotation shaft being situated in a path of said light beam;
   a light interrupting means operatively associated with the rotation shaft which sequentially interrupts the light beam during rotation of said shaft so as to produce light pulses on the light detection means;
   a light pulse counting means operatively connected to said light detection means;
   for counting light pulses on said light detection means which are representative of said electrical power consumption; and
   a protective cover placed near one end of said rotation shaft, covering the light source means and the light detection means of the reading device and surrounding the rotation shaft.

2. A watt-hour meter according to claim 1 wherein the light interrupting means comprises an opening in said rotation shaft.

3. A watt-hour meter according to claim 1 wherein the light interrupting means comprises a groove cut in said rotation shaft.

4. A watt-hour meter according to claim 1 wherein the protective cover is made of an opaque material and is generally cube-shaped.

5. A watt-hour meter according to claim 1 wherein the light interrupting means comprises a light absorbing element placed on said rotation shaft.

6. A watt-hour meter according to claim 1 wherein the light interrupting means comprises two openings cut into said rotation shaft, one opening being cut at angle from the other opening in a generally perpendicular plane with respect to the axis of said rotation shaft; the light source means comprises two light emitting diodes placed one on top of the other; the light detection means comprises two photodetectors placed one on top of the other in alignment with said two light emitting diodes.

7. A watt-hour meter according to claim 1 wherein the light source means and the light detection means are comprised of optical fibers.

8. In a watt-hour meter for metering electrical power consumption of the type including a rotation shaft, and a disc mounted to the rotation shaft, said watt-hour meter being further provided with a reading device responsive to the rotation shaft, the reading device comprising:

- a light source means for producing a light beam;
- a light detection means placed at a certain distance from the light source means in a path of the light beam;
- a light interrupting means mounted on said shaft which sequentially interrupts said light beam of said light source during rotation of said shaft so as to produce light pulses on the light detection means;
- a light pulse counting means operatively connected to said light detection means;
- for counting light pulses on said light detection means which are representative of said electrical power consumption; and
- a protective cover of a generally cube-shaped configuration made of an opaque material covering said light source means and the light detection means and partially surrounding said rotation shaft, the protective cover located near one end of said rotation shaft such that the protective cover surrounds a portion of the rotation shaft;

wherein the light interrupting means comprises an opening into said rotation shaft.

9. A watt-hour meter according to claim 8 wherein a register means comprises reading dials coupled to said rotation shaft via a pinion situated near one end of said shaft.

10. A watt-hour meter according to claim 8 wherein the light interrupting means comprises two grooves cut into said rotation shaft, one groove being cut at angle from the other groove in a generally perpendicular plane with respect to the axis of said rotation shaft; the light source means comprises two light emitting diodes placed one on top of the other; the light detection means comprises two photodetectors placed one on top of the other in alignment with said two light emitting diodes.

11. A watt-hour meter according to claim 8 wherein the light interrupting means comprise two openings cut into said rotation shaft, one opening being cut at angle from the other opening in a generally perpendicular plane with respect to the axis of said rotation shaft; the light source means comprise two light emitting diodes placed one on top of the other; the light detection means comprise two photodetectors placed one on top of the other in alignment with said two light emitting diodes.

12. A watt-hour meter according to claim 8 wherein the light source means and the light detection means are comprised of optical fibers.

* * * * *

UNITED STATES PATENT AND TRADEMARK OFFICE
CERTIFICATE OF CORRECTION

PATENT NO. : 5,089,771
DATED : February 18, 1992
INVENTOR(S) : Tanguay et al.

It is certified that error appears in the above-identified patent and that said Letters Patent is hereby corrected as shown below:

At column 6, lines 35-39 should read as follows:

a light pulse counting means operatively connected to said light detection means for counting light pulses on said light detection means which are representative of said electrical power consumption; and At column 7, lines 17-21 should read as follows:

a light pulse counting means operatively connected to said light detection means for counting light pulses on said light detection means which are representative of said electrical power consumption; and Signed and Sealed this Fourteenth Day of September, 1993

Attest:

BRUCE LEHMAN

*Attesting Officer*      *Commissioner of Patents and Trademarks*